United States Patent
Grunow et al.

(10) Patent No.: US 9,261,924 B2
(45) Date of Patent: Feb. 16, 2016

(54) HEAT PIPE ASSEMBLIES

(71) Applicant: Dell Products, L.P., Round Rock, TX (US)

(72) Inventors: David William Grunow, Round Rock, TX (US); Daniel William Kehoe, Cedar Park, TX (US); Matthew B. Mendelow, Austin, TX (US)

(73) Assignee: DELL INC., Round Rock, TX (US)

( * ) Notice: Subject to any disclaimer, the term of this patent is extended or adjusted under 35 U.S.C. 154(b) by 253 days.

(21) Appl. No.: 14/018,957

(22) Filed: Sep. 5, 2013

(65) Prior Publication Data

US 2015/0062802 A1    Mar. 5, 2015

(51) Int. Cl.
| | | |
|---|---|---|
| *G06F 1/20* | (2006.01) | |
| *H01L 23/34* | (2006.01) | |
| *H01L 23/427* | (2006.01) | |
| *H05K 7/20* | (2006.01) | |
| *H01L 23/40* | (2006.01) | |

(52) U.S. Cl.
CPC ........ *G06F 1/20* (2013.01); *G06F 1/203* (2013.01); *H01L 23/34* (2013.01); *H01L 23/427* (2013.01); *H05K 7/20809* (2013.01); *H01L 23/4006* (2013.01); *H01L 2924/0002* (2013.01); *Y10T 29/49126* (2015.01)

(58) Field of Classification Search
CPC ......... G06F 1/20; H01L 23/34; H01L 23/427; H01L 23/4006; H05K 7/20336; H05K 7/20809
USPC ............ 361/679.47, 700; 165/104.29; 29/830
See application file for complete search history.

(56) References Cited

U.S. PATENT DOCUMENTS

| | | | | |
|---|---|---|---|---|
| 6,542,365 B2 * | 4/2003 | Inoue | ................... | H01L 23/4006 165/80.4 |
| 6,882,536 B2 * | 4/2005 | Deeney | .................... | H01L 23/36 165/185 |
| 6,937,474 B2 * | 8/2005 | Lee | ........................ | H01L 23/427 165/104.21 |
| 7,042,725 B2 * | 5/2006 | Martin | ................... | H01L 23/473 165/80.4 |
| 7,177,154 B2 * | 2/2007 | Lee | .......................... | G06F 1/181 165/104.33 |
| 7,248,474 B2 * | 7/2007 | Cheng | .................... | H01L 23/427 257/E23.088 |
| 7,250,674 B2 * | 7/2007 | Inoue | ................... | H01L 23/4006 165/80.4 |
| 7,319,588 B2 * | 1/2008 | Peng | ..................... | H01L 23/427 165/104.21 |
| 7,382,616 B2 * | 6/2008 | Stefanoski | ................ | G06F 1/20 165/104.33 |
| 7,499,261 B2 * | 3/2009 | Hash | ................... | H05B 37/0254 200/33 R |

(Continued)

*Primary Examiner* — Anthony Haughton
*Assistant Examiner* — Matt Dhillon
(74) *Attorney, Agent, or Firm* — Fogarty, L.L.C.

(57) ABSTRACT

Heat pipe assemblies for Information Handling Systems (IHSs). In some embodiments, an IHS may comprise a motherboard including a Central Processing Unit (CPU); a cooling system coupled to the motherboard, the cooling system including a heat pipe, the CPU coupled to a first side of the heat pipe; and a daughterboard coupled to the motherboard and including a Graphics Processing Unit (GPU) coupled to a second side of the heat pipe. In other embodiments, a method may include providing a motherboard including a CPU; coupling a cooling system to the motherboard, the cooling system including a heat pipe, the CPU coupled to a first side of the heat pipe; and coupling a daughterboard to the motherboard, the daughterboard including a GPU coupled to a second side of the heat pipe.

20 Claims, 5 Drawing Sheets

(56) References Cited

U.S. PATENT DOCUMENTS

| | | | | |
|---|---|---|---|---|
| 7,511,947 B2* | 3/2009 | Leng | H01L 23/427 | |
| | | | 165/104.21 | |
| 7,515,417 B2* | 4/2009 | Lee | G06F 1/20 | |
| | | | 165/104.26 | |
| 7,965,508 B2* | 6/2011 | Yamamoto | H01L 23/473 | |
| | | | 174/15.1 | |
| 7,990,699 B2* | 8/2011 | Lian | F28D 15/0275 | |
| | | | 165/104.21 | |
| 8,018,717 B2* | 9/2011 | Corbeil | A61B 6/037 | |
| | | | 165/104.33 | |
| 8,164,902 B2* | 4/2012 | Matsushima | H05K 7/20245 | |
| | | | 165/104.26 | |
| 8,421,235 B2* | 4/2013 | Ide | H01L 23/473 | |
| | | | 257/675 | |
| 8,482,916 B2* | 7/2013 | Wang | G06F 1/203 | |
| | | | 361/679.47 | |
| 8,547,699 B1* | 10/2013 | McCleary | H05K 7/20445 | |
| | | | 165/104.33 | |
| 8,743,541 B2* | 6/2014 | Hata | H05K 7/20972 | |
| | | | 165/80.4 | |
| 8,976,528 B2* | 3/2015 | Degner | G06F 1/20 | |
| | | | 165/104.26 | |
| 2003/0189815 A1* | 10/2003 | Lee | H01L 23/427 | |
| | | | 361/719 | |
| 2011/0199746 A1* | 8/2011 | Lee | H01L 23/49541 | |
| | | | 361/783 | |
| 2013/0048256 A1* | 2/2013 | Wang | H01L 23/3672 | |
| | | | 165/121 | |
| 2013/0215570 A1* | 8/2013 | Huang | G06F 1/20 | |
| | | | 361/679.47 | |

* cited by examiner

HEAT PIPE ASSEMBLIES

FIELD

This disclosure relates generally to Information Handling Systems (IHSs), and more specifically, to heat pipe assemblies for IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

In some cases, an IHS may include a cooling system that removes heat produced by certain components (e.g., processors, chipsets, graphics cards, hard disk drives, etc.) to help maintain those components within permissible operating temperature limits. An example of such a cooling system is known as a "heat pipe."

SUMMARY

Embodiments of heat pipe assemblies for Information Handling Systems (IHSs) are described herein. In an illustrative, non-limiting embodiment, a system comprises a heat pipe including a first surface, a second surface adjacent to the first surface, a third surface adjacent to the second surface and opposite from the first surface, and a fourth surface adjacent to the third surface and opposite from the second surface; a first semiconductor device assembly coupled to a portion of the first surface; and a second semiconductor device assembly coupled to a portion of the third surface.

The system may also include a heat spreader having a first portion adjacent to the second surface of the heat pipe and a second portion adjacent to the fourth surface of the heat pipe, the head spreader coupled to the first and second semiconductor device assemblies. In some cases, the heat spreader may include an indented portion configured to accommodate at least one of the first or second semiconductor device assemblies. For example, the first semiconductor device may be a Central Processing Unit (CPU) and the second semiconductor device may be a Graphics Processing Unit (GPU). Also, the first device may be mounted on a first Printed Circuit Board (PCB) and the second device may be mounted on a second PCB.

In another illustrative, non-limiting embodiment, an IHS may comprise a motherboard including a CPU; a cooling system coupled to the motherboard, the cooling system including a heat pipe, the heat pipe having a first side and a second side opposite to the first side, the CPU coupled to the first side of the heat pipe; and a daughterboard coupled to the motherboard, the daughterboard including a Graphics Processing Unit (GPU), the GPU coupled to the second side of the heat pipe. In some implementations, the CPU may be coupled to a layer of Thermal Interface Material (TIM), the layer of TIM may be coupled to a thermally conductive block, and the thermally conductive block may be coupled to the first side of the heat pipe.

The layer of TIM may include thermal grease, and the thermally conductive block may include a copper block. The GPU may be coupled to a TIM layer, the TIM layer may be coupled to a thermally conductive block, and the thermally conductive block may be coupled to the second side of the heat pipe. For example, the TIM layer may include a thermal pad, and the thermally conductive block may include a copper block. The cooling system may further comprises a heat spreader surrounding at least a portion of the heat pipe and a heat exchanger coupled to another portion of the heat pipe. The heat spreader may include a first set of one or more mounts configured to couple the heat spreader to the motherboard, and a second set of one or more mounts configured to couple the heat spreader to the daughterboard. Also, the heat spreader may include an indented portion configured to accommodate the GPU on the second side of the heat pipe.

In yet another illustrative, non-limiting embodiment, a method may include providing a motherboard including a CPU; coupling a cooling system to the motherboard, the cooling system including a heat pipe, the heat pipe having a first side and a second side opposite to the first side, the CPU coupled to the first side of the heat pipe; and coupling a daughterboard to the motherboard, the daughterboard including a GPU, the GPU coupled to the second side of the heat pipe. The method may also include coupling a first layer of TIM to the CPU, coupling a first thermally conductive block to the first layer of TIM, and coupling a portion of the first side of the heat pipe to the first thermally conductive block.

The method may further include coupling a second thermally conductive block to a portion of the second side of the heat pipe, coupling a second layer of TIM to the second thermally conductive block, and coupling the GPU to the second thermally conductive block. For example, the cooling system may include a heat spreader coupled to the heat pipe. The method may also include coupling the heat spreader to the motherboard via a first set of one or more mounts and placing the heat pipe between two portions of the heat spreader. The method may further include coupling the daughterboard to the heat spreader via a second set of one or more mounts. The heat spreader may include an indented portion configured to accommodate the GPU on the second side of the heat pipe.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail in FIG. 7.

In some cases, an IHS may also include one or more cooling systems that remove heat produced by certain components (e.g., processors, chipsets, graphics cards, hard disk drives, etc.) to help maintain those components within permissible operating temperature limits, therefore preventing temporary malfunction or permanent failure due to overheating. An example of such a cooling system is the "heat pipe."

Heat pipes began to be used in IHSs in the late 1990s, when increased power requirements and heat emission put greater demands on more existing cooling systems. Generally speaking, a heat pipe is a hollow tube containing a heat transfer liquid. In some implementations, an IHS component may be thermally coupled to a heat pipe and the heat pipe may be attached to a remotely located radiator heat sink, such that the heat pipe transfers heat from the component to the radiator. The radiator is then cooled using a fan or the like. In contrast with embodiments described herein, each component within a traditional IHS that requires heat pipe cooling is coupled to its own distinct heat pipe or other cooling system.

In some embodiments described herein, two or more HIS components may be thermally coupled to the same heat pipe. For example, a heat pipe may include a first surface, a second surface adjacent to the first surface, a third surface adjacent to the second surface and opposite from the first surface, and a fourth surface adjacent to the third surface and opposite from the second surface. Accordingly, a first semiconductor device assembly or component may be coupled to a portion of the first surface and a second semiconductor device assembly or component may be coupled to a portion of the third surface. For example, the first and second semiconductor devices may be a Central Processing Unit (CPU) and a Graphics Processing Unit (GPU), respectively. A heat spreader may have a first portion adjacent to the second surface of the heat pipe and a second portion adjacent to the fourth surface of the heat pipe, and the head spreader may be coupled to the first and second semiconductor device assemblies. The heat pipe may then be coupled to a remotely located radiator heat sink.

Figure 1:
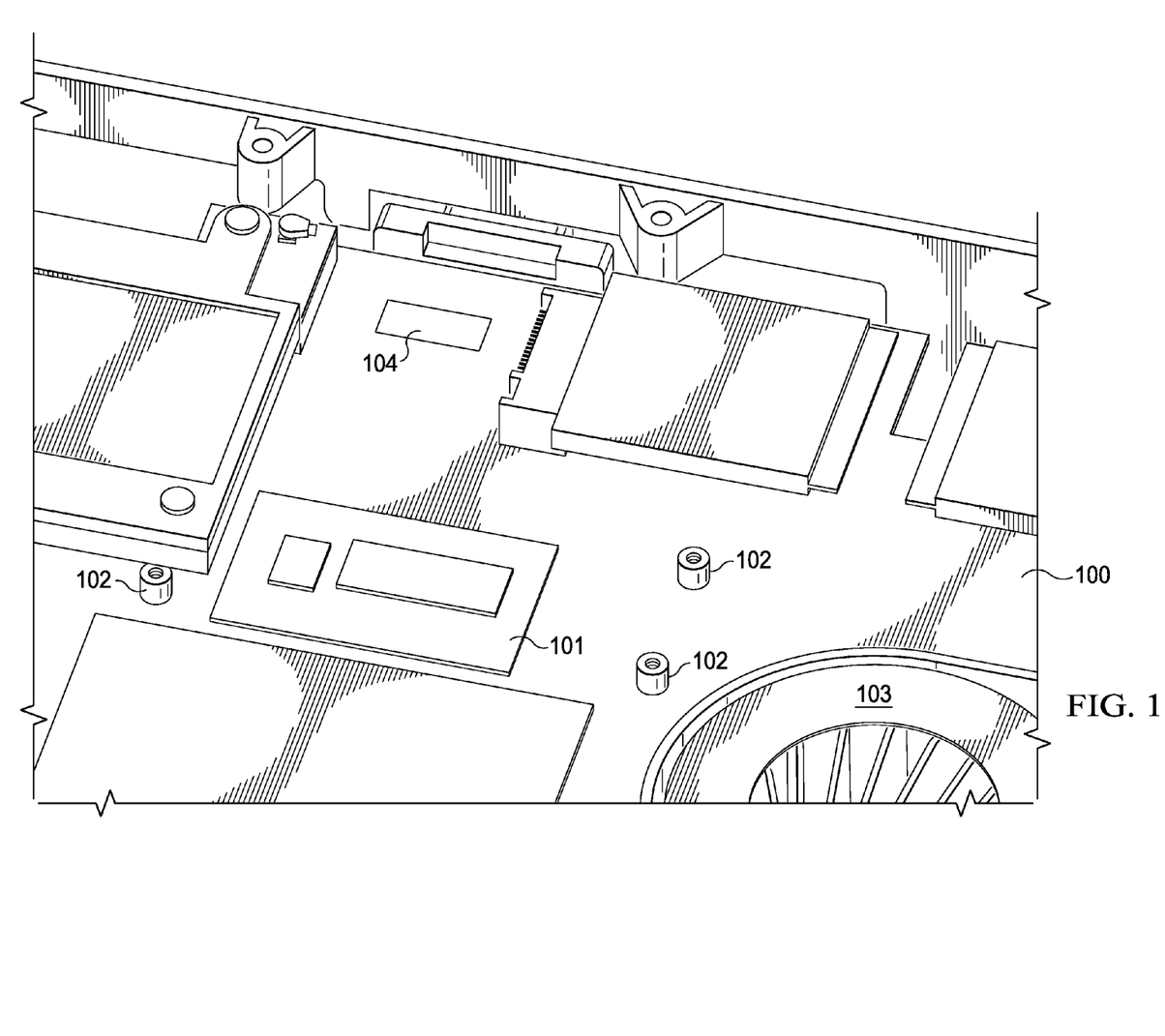
FIG. 1 shows a three-dimensional view illustrating an example of a motherboard according to some embodiments.

To better illustrate the foregoing, FIG. 1 shows a three-dimensional view illustrating an example of motherboard 100 according to some embodiments. As shown, motherboard 100 includes CPU 101, mounts 102, Remote Heat Exchanger (RHE) 103, and board-to-board connector 104. As a person of ordinary skill in the art will recognize in light of this disclosure, motherboard 100 also includes a plurality of other components coupled thereto, some of which are standard elements found within a typical IHS and therefore need not be detailed here.

Motherboard 100 (also known as a mainboard, system board, planar board, logic board, etc.) is the main Printed Circuit Board (PCB) found in IHSs and other systems. It holds many of the crucial electronic components of the system, such as CPU 101 and memor(ies), and provides connectors (e.g., board-to-board connector 104) for other elements and peripherals. As used herein, the term "motherboard" refers to a PCB with expansion capability—that is, motherboard 100 is the "mother" of all components attached to it, which may include, but are not limited to, sound cards, video cards, network cards, hard drives or other forms of persistent storage, TV tuner cards, etc.

Board-to-board connector 104 includes any electrical connector configured to allow another PCB (such as daughterboard 300 described below in FIG. 3) to be connected to motherboard 100. In the embodiment shown, connector 104 may be a stacking or mezzanine connector such that another PCB, when coupled to connector 104, has its surface parallel to the surface of motherboard 100. Meanwhile, mounts 102 may include any suitable number and/or type of PCB mounts such as, for example, screw mounts, terminals, posts, or the like. RHE 103 may include a radiator heat sink and a fan, which are remotely located on motherboard 100 with respect to the IHS component(s) being cooled—e.g., CPU 101.

Figure 2:
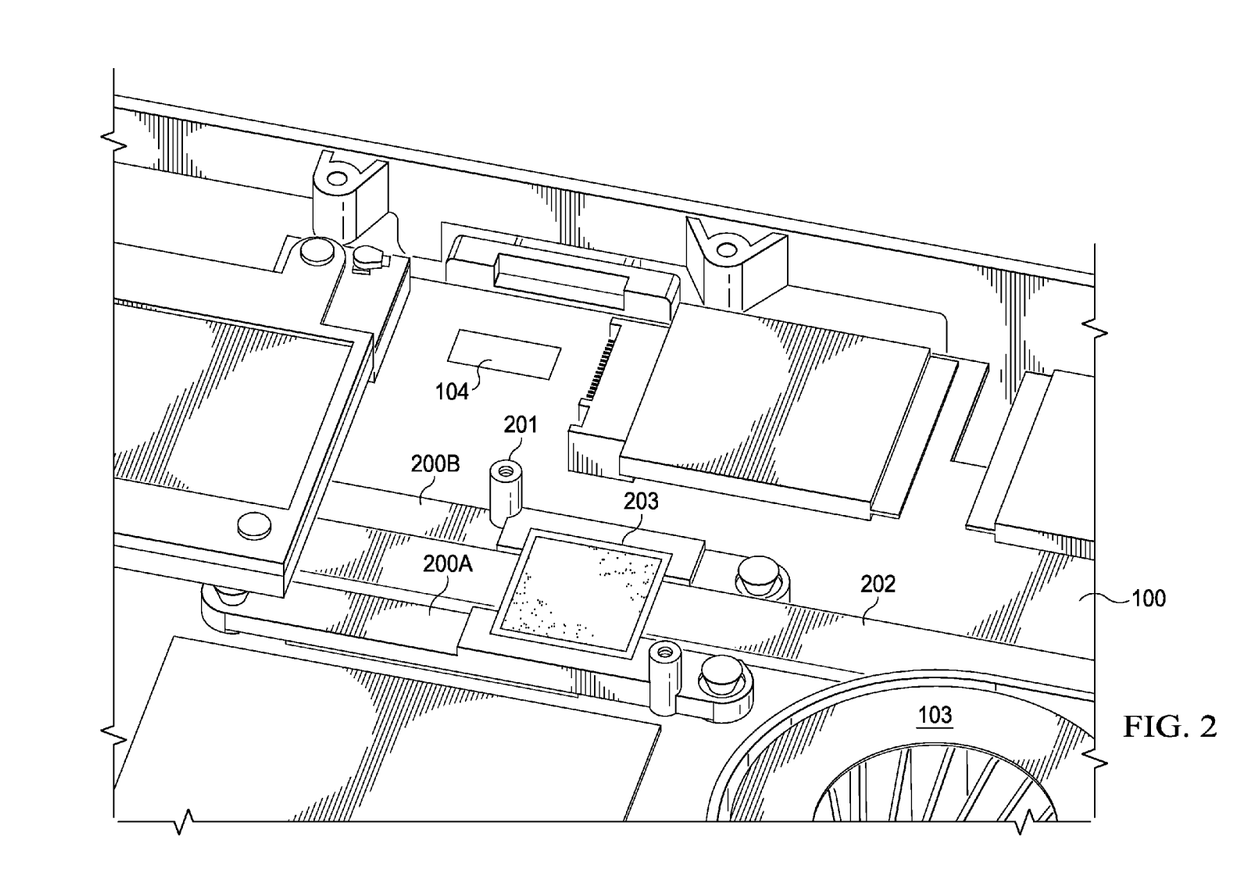
FIG. 2 shows a three-dimensional view illustrating an example of a heat spreader and heat pipe according to some embodiments.

FIG. 2 shows a three-dimensional view illustrating an example of heat spreader 200A/B and heat pipe 202 according to some embodiments. Particularly, starting from the configuration of FIG. 1, heat spreader portions 200A and 200B are now shown with heat pipe 202 laterally sandwiched between them. Heat pipe 202 is disposed over the surface of CPU 101 (not shown) and is thermally coupled thereto so as to promote a heat exchange process between CPU 101, heat spreader portions 200A and 200B, and a cooling fluid located within heat pipe 202.

As a result of the thermal coupling between these various elements, the operating temperature of CPU 101 is lowered as the temperature of the cooling fluid rises. The high temperature cooling fluid travels within heat pipe 202 to RHE 103, where it is cooled back again and returns to the area within heat pipe 202 above the surface of CPU 101. In summary, heat pipe 202 effectively transfers heat from CPU 101 to RHE 103.

Heat spreader portions 200A and 200B are coupled to motherboard 100 via mounts 102 (also shown in FIG. 1). In this example, each heat spreader portion 200A and 200B includes one or more respective mounts or posts 201. Heat spreader 200A/B also includes an indented portion configured to accommodate thermally conductive block 203, which may provide thermal coupling between another semiconductor device assembly or component (e.g., GPU 301 of FIG. 3) and heat pipe 202.

Figure 3:
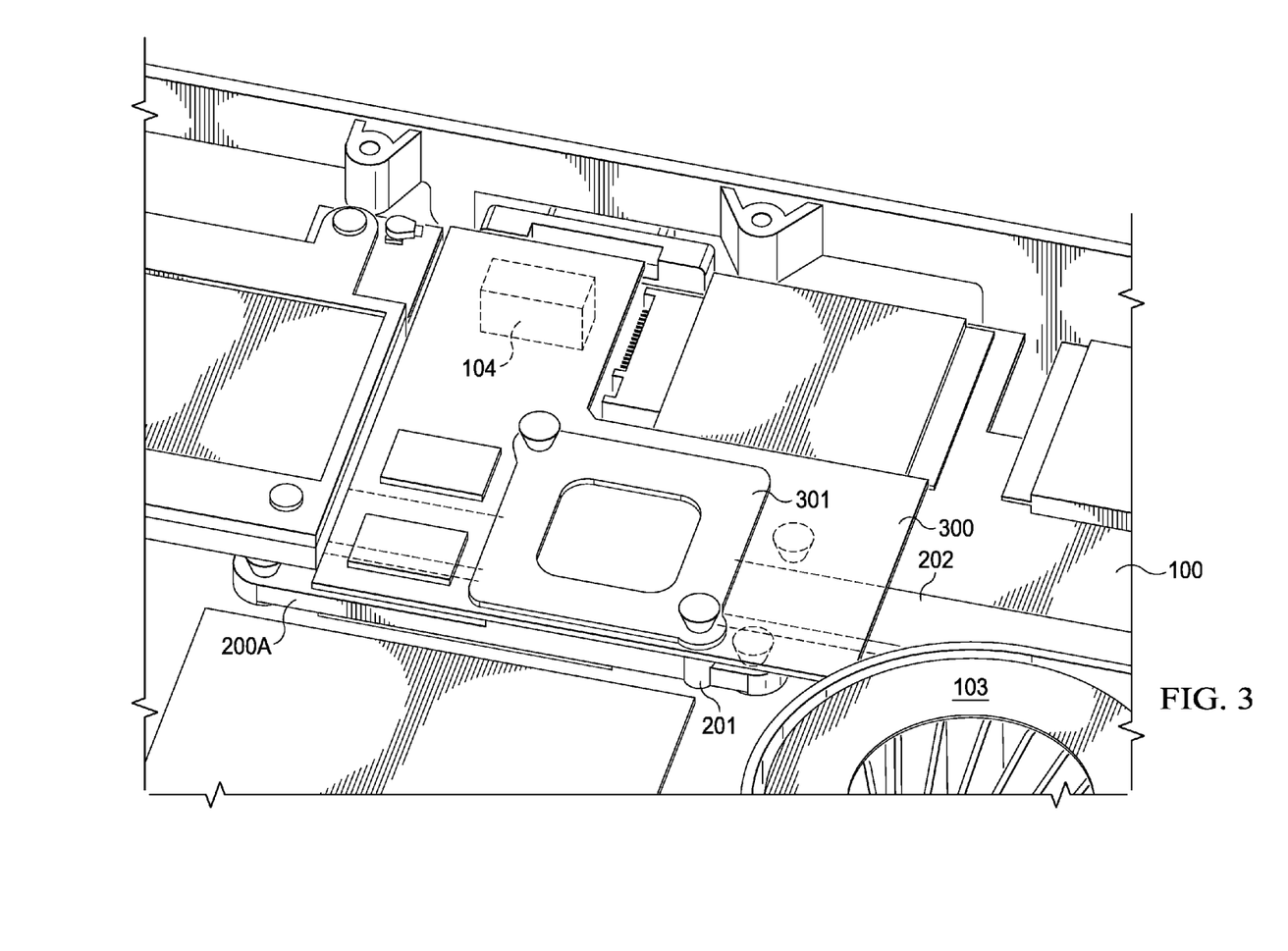
FIG. 3 shows a three-dimensional view illustrating an example of a daughterboard assembled upside down over the heat spreader and heat pipe according to some embodiments.

FIG. 3 shows a three-dimensional view illustrating an example of daughterboard 300 assembled upside down over heat spreader 200A/B and heat pipe 202 according to some embodiments. Particularly, daughterboard 300 is electrically coupled to motherboard 100 via board-to-board connector 104. Daughterboard 300 is also mechanically coupled to motherboard 100 and/or heat spreader 200A/B via mounts 201. In this example, daughterboard 300 includes GPU 301, which is thermally coupled to heat pipe 202 and to heat spreader 200A/B through thermally conductive block 203 (not shown).

It should be noted that CPU 101 and GPU 301 are in a face-to-face configuration with respect to each other—that is, daughterboard 300 and GPU 301 are upside down with respect to motherboard 100 and CPU 101 and heat pipe 202 is vertically sandwiched between them. As such, the packaging or encapsulant portions of CPU 101 and GPU 301 are thermally coupled to opposite sides of the same section of heat pipe 202. In some cases, the thermal connections between CPU 101/GPU 301 to heat pipe 202 and/or heat spreader 200A/B may be effected with one or more layers of thermally conductive materials or the like.

Figure 4:
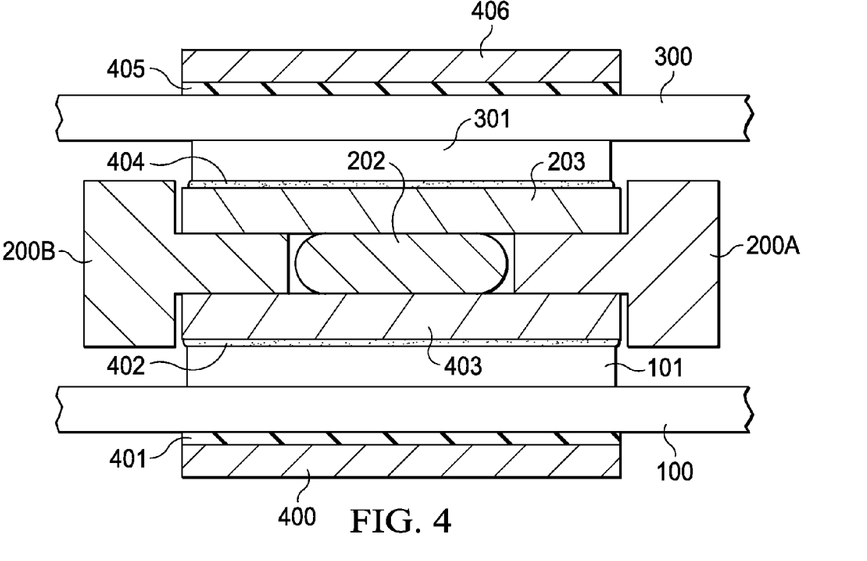
FIG. 4 shows a cross-sectional view illustrating an example of a heat pipe assembly according to some embodiments.

FIG. 4 shows a cross-sectional view illustrating an example of a heat pipe assembly according to some embodiments. Particularly, first backing plate 400 (e.g., sheet metal, etc.) is adjacent to first backing layer 401 (e.g., any suitable electrically insulating material, including, for example, polyester films, etc.). First backing layer 401 is coupled to motherboard 100. Motherboard 100 includes CPU 101 coupled thereto using any suitable chip mounting technique including, but not limited to, through-hole, surface mount, flat package, ball grid array, etc.

The top surface of CPU 101 is at least partially covered with first layer of thermal grease 402, which may be any thermal gel, compound, paste, etc. configured to increase the thermal conductivity of the thermal interface, more generically referred to as a layer of Thermal Interface Material or "TIM" layer. First thermally conductive block 403 (e.g., copper, etc.) is coupled to CPU 101 via thermal grease layer 402, and it is also coupled to heat pipe 202, heat spreader portion 200A, and heat spreader portion 200B. Specifically, first thermally conductive block 403 sits within a lower indentation of heat spreader 200A/B such that a top surface of first thermally conductive block 403 is flush and/or aligned with the bottom surface of heat pipe 202.

Second thermally conductive block 203 sits within an upper indentation of heat spreader 200A/B such that a bottom surface of second thermally conductive block 203 is flush and/or aligned with the top surface of heat pipe 202. Second layer of thermal grease 404 facilitates the thermal connection between second thermally conductive block 203 and GPU 301. GPU is coupled to daughterboard 300 using any suitable chip mounting technique, and daughterboard 300 is coupled to second backing layer 405 and second backing plate 406. In some cases, GPU board 300 and/or second backing plate 406 may be mechanically coupled (e.g., spring-loaded or otherwise) to spreader portions 200A/B and/or heat pipe 202.

In this implementation, heat pipe 202 has four surfaces. A first flat surface, a second curved surface adjacent to the first flat surface, a third flat surface adjacent to the second curved surface and opposite from the first flat surface, and a fourth curved surface adjacent to the third flat surface and opposite from the second curved surface. CPU 101 is thermally coupled to the first flat surface and GPU 301 is thermally coupled to the third flat surface. Moreover, heat spreader portion 200B is adjacent to the second curved surface, and heat spreader portion 200A is adjacent to the fourth curved surface.

Heat spreader 200A/B and heat pipe 202 may be constructed with any suitable materials. Examples of materials in pure or alloy form that have a high thermal conductivity and a wide range of coefficients of thermal expansion include, but are not limited to, molybdenum (Mo), tungsten (W), copper (Cu), aluminum (Al), ceramics, etc.

To illustrate an example of a practical implementation of the foregoing embodiments, consider the problem of leveraging the same laptop motherboard in two different IHSs. This task becomes very difficult when the two IHSs have different form factors and/or performance goals. For example, one IHS may be a 12" laptop computer and the other a 14" laptop computer. The 12" laptop has a CPU with integrated graphics, and the 14" laptop has separate CPU and GPU. The motherboard size is limited by the smallest form factor—that is, the 12" laptop with integrated graphics. Accordingly, in the 14" design, the discrete GPU is moved to a daughterboard. Often there is no way to package the discrete graphics daughterboard and a separate thermal solution on the 14" laptop.

Figure 5:
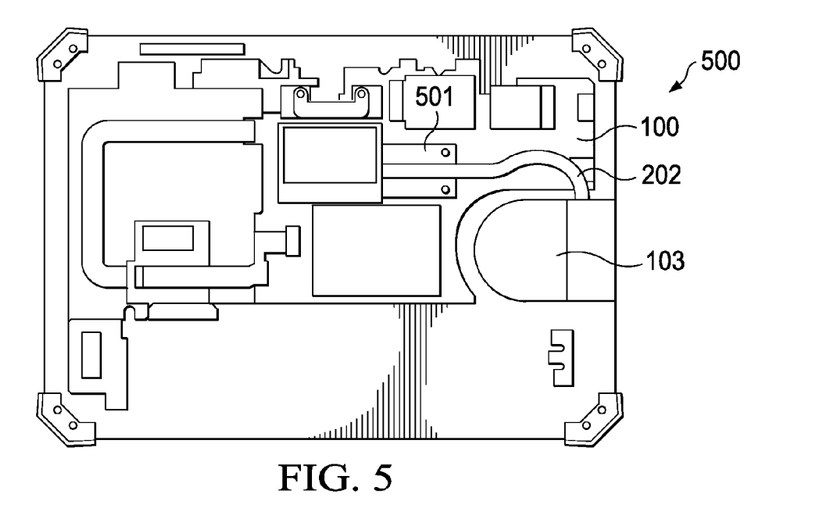
FIGS. 5 and 6 illustrate an example of a heat pipe assembly application used to leverage a same motherboard across Information Handling Systems (IHSs) having different form factors, according to some embodiments.
Figure 6:
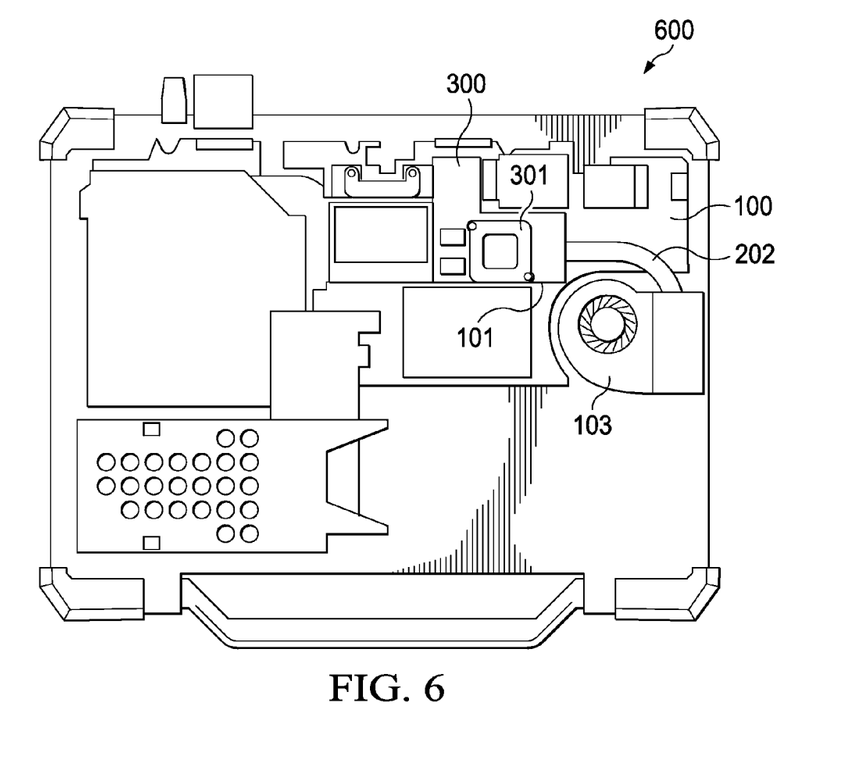

FIGS. 5 and 6 illustrate an example of a heat pipe assembly application used to leverage a same motherboard across IHSs having different form factors, according to some embodiments. Particularly, IHS 500 and HIS 600 correspond to the 12" and 14" laptops of the previous example. In FIG. 5, CPU 501 coupled to motherboard 100 of IHS 500 includes integrated graphics capabilities. Accordingly, CPU 501 is coupled to heat pipe 202 and RHE 103. In contrast, in FIG. 6, CPU 101 does not include integrated graphics, and daughterboard 300 having GPU 301 is coupled to motherboard 100 such that GPU 301 is coupled to heat pipe 202 and RHE 103.

In other words, using the embodiments described above, a discrete graphics daughterboard may be integrated into the thermal solution that is already in use for the CPU on the motherboard. The daughterboard assembles to the thermal solution casting. The heat pipe is sandwiched by the CPU on one side and the GPU on the opposite side. Assembling the daughterboard to the thermal solution reduces the impact to the motherboard and eliminates the need for a second thermal solution.

The foregoing approach may be seen as unconventional, among other reasons, because assembling a daughterboard to a thermal solution tends to increase the overall height of the IHS chassis and therefore results in thicker devices (compared to integrated solutions). Nonetheless, the embodiments discussed herein may be particularly useful, for example, for rugged mobility equipment, where product volumes are relatively low. Leveraging motherboards reduces development costs, and allows an IHS manufacturer to offer additional products while maintaining profit margins.

Figure 7:
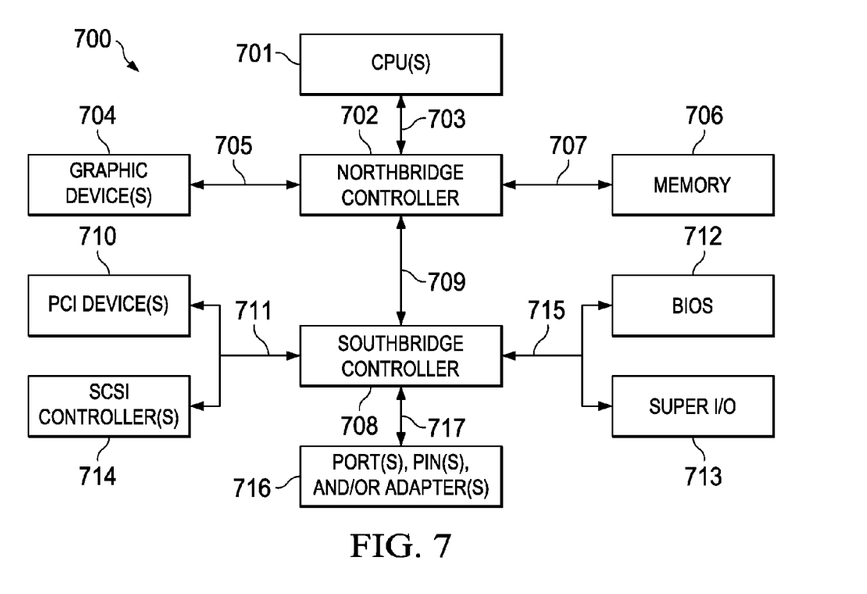
FIG. 7 is a block diagram of an example of an IHS according to some embodiments.

FIG. 7 is a block diagram an example of an IHS 700, such as IHSs 500 and 600 discussed above. As shown, IHS 700 includes one or more CPUs 701. In various embodiments, IHS 700 may be a single-processor system including one CPU 701, or a multi-processor system including two or more CPUs 701 (e.g., two, four, eight, or any other suitable number). CPU(s) 701 may include any processor capable of executing program instructions. For example, in various embodiments, CPU(s) 701 may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of CPU(s) 701 may commonly, but not necessarily, implement the same ISA.

CPU(s) 701 are coupled to northbridge controller or chipset 701 via front-side bus 703. Northbridge controller 702 may be configured to coordinate I/O traffic between CPU(s) 701 and other components. For example, in this particular implementation, northbridge controller 702 is coupled to graphics device(s) 704 (e.g., one or more video cards or adaptors, etc.) via graphics bus 705 (e.g., an Accelerated Graphics Port or AGP bus, a Peripheral Component Interconnect or PCI bus, etc.). Northbridge controller 702 is also coupled to system memory 706 via memory bus 707. Memory 706 may be configured to store program instructions and/or data accessible by CPU(s) 701. In various embodiments, memory 706 may be implemented using any suitable memory technology, such as static RAM (SRAM), synchronous dynamic RAM (SDRAM), nonvolatile/Flash-type memory, or any other type of memory.

Northbridge controller 702 is coupled to southbridge controller or chipset 708 via internal bus 709. Generally speaking, southbridge controller 708 may be configured to handle various of IHS 700's I/O operations, and it may provide interfaces such as, for instance, Universal Serial Bus (USB), audio, serial, parallel, Ethernet, etc., via port(s), pin(s), and/or adapter(s) 716 over bus 717. For example, southbridge controller 708 may be configured to allow data to be exchanged between IHS 700 and other devices, such as other IHSs attached to a network. In various embodiments, southbridge controller 708 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 708 may also enable connection to one or more keyboards, keypads, touch screens, scanning devices, voice or optical recognition devices, or any other devices suitable for entering or retrieving data. Multiple I/O devices may be present in IHS 700. In some embodiments, I/O devices may be separate from IHS 700 and may interact with IHS 100 through a wired or wireless connection. As shown, southbridge controller 708 is further coupled to one or more PCI devices 710 (e.g., modems, network cards, sound cards, video cards, etc.) and to one or more SCSI controllers 714 via parallel bus 711. Southbridge controller 708 is also coupled to Basic I/O System (BIOS) 712 and to Super I/O Controller 713 via Low Pin Count (LPC) bus 715.

BIOS 712 includes non-volatile memory having program instructions stored thereon. Those instructions may be usable CPU(s) 701 to initialize and test other hardware components and/or to load an Operating System (OS) onto IHS 700. Super I/O Controller 713 combines interfaces for a variety of lower bandwidth or low data rate devices. Those devices may include, for example, floppy disks, parallel ports, keyboard and mouse, temperature sensor and fan speed monitoring/control, etc.

In some cases, IHS 700 may be configured to provide access to different types of computer-accessible media separate from memory 706. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 700 via northbridge controller 702 and/or southbridge controller 708.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that IHS 700 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 702 may be combined with southbridge controller 708, and/or be at least partially incorporated into CPU(s) 701. In other implementations, one or more of the devices or components shown in FIG. 7 may be absent, or one or more other components may be added. Accordingly, systems and methods described herein may be implemented or executed with other IHS configurations.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. For example, although discussed in the context of a CPU and a GPU, a person of ordinary skill in the art will recognize in light of this disclosure that any type and/or number of semiconductor device assemblies or components may be used. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A system, comprising:
   a heat pipe including a first surface, a second surface adjacent to the first surface, a third surface adjacent to the second surface and opposite from the first surface, and a fourth surface adjacent to the third surface and opposite from the second surface, wherein the first and third surfaces are flat and parallel with respect to each other;
   a first semiconductor device assembly coupled to a portion of the first surface; and
   a second semiconductor device assembly coupled to a portion of the third surface such that the heat pipe is sandwiched between the first and second semiconductor devices.

2. The system of claim 1, further comprising a heat spreader having a first portion adjacent to the second surface of the heat pipe and a second portion adjacent to the fourth surface of the heat pipe, the head spreader coupled to the first and second semiconductor device assemblies.

3. The system of claim 2, wherein the heat spreader includes an indented portion configured to accommodate at least one of the first or second semiconductor device assemblies.

4. The system of claim 1, wherein the first semiconductor device assembly is a Central Processing Unit (CPU) and wherein the second semiconductor device assembly is a Graphics Processing Unit (GPU).

5. The system of claim 1, wherein the first semiconductor device assembly is mounted on a first Printed Circuit Board (PCB) and wherein the second semiconductor device assembly is mounted on a second PCB.

6. An Information Handling System (IHS), comprising:
   a motherboard including a Central Processing Unit (CPU);
   a cooling system coupled to the motherboard, the cooling system including a heat pipe, the heat pipe having a first side and a second side opposite to the first side, wherein the first and second sides are flat and parallel with respect to each other, and wherein the CPU is coupled to the first side of the heat pipe; and
   a daughterboard coupled to the motherboard, the daughterboard including a Graphics Processing Unit (GPU), the GPU coupled to the second side of the heat pipe such that the heat pipe is sandwiched between the CPU and the GPU.

7. The IHS of claim 6, wherein the CPU is coupled to a layer of Thermal Interface Material (TIM), the layer of TIM is coupled to a thermally conductive block, and the thermally conductive block is coupled to the first side of the heat pipe.

8. The IHS of claim 7, wherein the layer of TIM includes thermal grease, and wherein the thermally conductive block includes a copper block.

9. The IHS of claim 6, wherein the GPU is coupled to a layer of Thermal Interface Material (TIM), the layer of TIM is coupled to a thermally conductive block, and the thermally conductive block is coupled to the second side of the heat pipe.

10. The IHS of claim 9, wherein the layer of TIM includes a thermal pad, and wherein the thermally conductive block includes a copper block.

11. The IHS of claim 6, wherein the cooling system further comprises a heat spreader surrounding at least a portion of the heat pipe and a heat exchanger coupled to another portion of the heat pipe.

12. The IHS of claim 11, wherein the heat spreader includes a first set of one or more mounts configured to couple the heat spreader to the motherboard, and a second set of one or more mounts configured to couple the heat spreader to the daughterboard.

13. The IHS of claim 11, wherein the heat spreader includes an indented portion configured to accommodate the GPU on the second side of the heat pipe.

14. A method, comprising:
   providing a motherboard including a Central Processing Unit (CPU);
   coupling a cooling system to the motherboard, the cooling system including a heat pipe, the heat pipe having a first side and a second side opposite to the first side, wherein the first and second sides are flat and parallel with respect to each other, and wherein the CPU is coupled to the first side of the heat pipe; and
   coupling a daughterboard to the motherboard, the daughterboard including a Graphics Processing Unit (GPU), the GPU coupled to the second side of the heat pipe such that a cross-section of the heat pipe is sandwiched between the CPU and the GPU.

15. The method of claim 14, further comprising coupling a first layer of Thermal Interface Material (TIM) to the CPU, coupling a first thermally conductive block to the first layer of TIM, and coupling the a portion of the first side of the heat pipe to the first thermally conductive block.

16. The method of claim 15, further comprising coupling a second thermally conductive block to a portion of the second side of the heat pipe, coupling a second layer of TIM to the second thermally conductive block, and coupling the GPU to the second thermally conductive block.

17. The method of claim 14, wherein the cooling system includes a heat spreader coupled to the heat pipe.

18. The method of claim 17, further comprising coupling the heat spreader to the motherboard via a first set of one or more mounts and placing the heat pipe between two portions of the heat spreader.

19. The method of claim 18, further comprising coupling the daughterboard to the heat spreader via a second set of one or more mounts.

20. The method of claim 19, wherein the heat spreader includes an indented portion configured to accommodate the GPU on the second side of the heat pipe.

* * * * *

UNITED STATES PATENT AND TRADEMARK OFFICE
CERTIFICATE OF CORRECTION

PATENT NO. : 9,261,924 B2
APPLICATION NO. : 14/018957
DATED : February 16, 2016
INVENTOR(S) : David William Grunow et al.

Page 1 of 1

It is certified that error appears in the above-identified patent and that said Letters Patent is hereby corrected as shown below:

On the Title page, item (73), Assignee:, delete "DELL INC., Round Rock, TX (US)" and insert --Dell Products, L.P., Round Rock, TX (US)--.

Signed and Sealed this
Twelfth Day of July, 2016

Michelle K. Lee
*Director of the United States Patent and Trademark Office*